United States Patent
Lin et al.

(10) Patent No.: US 7,501,612 B2
(45) Date of Patent: *Mar. 10, 2009

(54) CMOS LIGHT SENSOR WITH THE QUANTITY OF LIGHT SENSING CELLS ALONG A LINE IS MORE THAN THE QUANTITY OF CORRESPONDING CAPACITORS AND OPERATION METHOD THEREOF

(76) Inventors: Ben Min-Jer Lin, No. 9, Lane 9, Lishan St., Hsinchu City (TW); Shih-Huang Chen, No.12, Lane 206, Hsin-Chuang St., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/736,354

(22) Filed: Apr. 17, 2007

(65) Prior Publication Data

US 2007/0181782 A1 Aug. 9, 2007

Related U.S. Application Data

(63) Continuation of application No. 10/249,402, filed on Apr. 7, 2003, now Pat. No. 7,250,594.

(30) Foreign Application Priority Data

Jul. 30, 2002 (TW) .............................. 91116948 A

(51) Int. Cl.
*H01J 40/14* (2006.01)
(52) U.S. Cl. ................................. 250/214 R; 250/208.1
(58) Field of Classification Search ............. 250/214 R, 250/214.1, 208.1, 214 SW, 214 LS; 257/290, 257/291, 440
See application file for complete search history.

(56) References Cited

U.S. PATENT DOCUMENTS

| 4,424,590 | A * | 1/1984 | Ozawa ........................ 382/324 |
| 6,885,028 | B2 | 4/2005 | Nishiki et al. |
| 2003/0020969 | A1 | 1/2003 | Kimura |
| 2004/0056179 | A1 | 3/2004 | Lin et al. |
| 2007/0069110 | A1 | 3/2007 | Lin et al. |

FOREIGN PATENT DOCUMENTS

CN 2198728YY 5/1995

* cited by examiner

*Primary Examiner*—Que T Le
(74) *Attorney, Agent, or Firm*—Stolowitz Ford Cowger LLP

(57) ABSTRACT

A CMOS light sensor and the operation method thereof are disclosed. The CMOS light sensor has a plurality of light sensing lines and a plurality of capacitor lines. Each light sensing line has a plurality of light sensors such that the number of capacitors in each capacitor line is smaller than the number of light sensing cells in each light sensing line. The capacitors are used for holding a portion of the potentials produced by the light sensing cells due to illumination. The method of operating the CMOS light sensor includes transferring the data captured by the light sensing line to the capacitor line and reading out the data according to a predefined order so that the leakage of charges from the capacitor is reduced.

39 Claims, 5 Drawing Sheets ial light sensor with the quantity of light sensing cells along a line is more than the quantity of corresponding capacitors and operation method thereof

CMOS LIGHT SENSOR WITH THE QUANTITY OF LIGHT SENSING CELLS ALONG A LINE IS MORE THAN THE QUANTITY OF CORRESPONDING CAPACITORS AND OPERATION METHOD THEREOF

CROSS REFERENCE TO RELATED APPLICATIONS

The present application is a continuation of U.S. Ser. No. 10/249,402, filed Apr. 7, 2003, now U.S. Pat. No. 7,250,594 the specification of which is incorporated herein. The present application and U.S. application Ser. No. 10/249,402, claim the priority benefit of Taiwan Application Serial No. 91116948, filed Jul. 30, 2002, the specification of which is incorporated herein.

BACKGROUND OF THE INVENTION

1. Field of Invention

The present invention relates to a CMOS light sensor and the operation method thereof. More particularly, the present invention relates to a CMOS light sensor and operation method that uses segment processing.

2. Description of Related Art

Most light sensors are classified into two major types, a charge-coupled device (CCD) or a CMOS light sensor. In a conventional CCD sensor, each light sensing line is assigned a group of shift registers for holding the charges produced by the CCD sensing line. In general, the amount of charges produced by the CCD sensor depends on the strength of illumination. Once the charges are fully transferred to the shift registers, the charges are sequentially shifted away from the shift registers to the circuit in the next processing stage. Similarly, as shown in FIG. 1, each CMOS light sensor 10 has a plurality of light sensing lines (12a, 14a and 16a) and each has a functional element similar to the shift register in the charge couple device. However, instead of shift registers, these functional elements are capacitors.

The structure of the CMOS light sensor 10 and the conventional CCD sensor are almost identical except the deployment of a capacitor in the former instead of a shift register. Hence, the method of operating the CMOS light sensor 10 is very similar to the method of operating the CCD sensor. The CMOS sensor 10 is exposed to light so that the sensing cells (such as 120a, 122a, 140a, 142a, 160a and 162a) in the light sensing lines (12a, 14a and 16a) generate an amount of electric charges in proportional to the intensity of illumination. Thereafter, various sensor cells (such as 120a, 122a, 136a and 138a) within the same light sensing line (such as 12a) are sampled individually to reproduce a corresponding electric potential. The capacitors within the aforementioned capacitor line (such as 12b) are actually storage device for registering the sampled electric potential.

In general, the capacitor line registers the resultant electric potentials produced by the entire light sensing line all at once but the electric potentials within the capacitor line are read out sequentially. Therefore, time to read out all of the potentials within the capacitor line increases with the number of sensor cells in a light sensing line. Since charge leakage occurs on most capacitors, the total number of charges drained away from the capacitor increases with time. If too many charges leak away from the capacitor, the actual stored data (electric potential) may be seriously distorted.

SUMMARY OF INVENTION

Accordingly, one object of the present invention is to provide a CMOS light sensor and operation method thereof. The CMOS light sensor has a capacitor line with a count of capacitors smaller than the count of light sensing cells in a light sensing line. Hence, all the data produced by the light sensing line can be read out in a few reading operations. Ultimately, data retaining period of data within each capacitor is shortened considerably when compared with a conventional technique.

To achieve these and other advantages and in accordance with the purpose of the invention, as embodied and broadly described herein, the invention provides a CMOS light sensor. The CMOS light sensor has a light sensing line and a capacitor line. The light sensing line has a plurality of light sensing cells. The count of capacitors in the capacitor line is smaller than the count of light sensing cells in the light sensing line. The capacitors along the capacitor line store up a portion of the potentials produced by the light sensing cells along the light sensing line.

This invention also provides an alternative CMOS light sensor. The CMOS light sensor has a plurality of light sensing lines and a group of capacitor lines. Each light sensing line has a plurality of light sensing cells and each group of capacitor lines has at least one capacitor line. The count of capacitors in each capacitor line is smaller than the count of light sensing cells in each light sensing line. Furthermore, the potentials produced by the light sensing cells in each light sensing line is transferred in sequence to the capacitor lines in the capacitor line group.

This invention also provides a method of operating a CMOS light sensor. A portion of the light sensing cells in the CMOS light sensor is illuminated to produce a corresponding set of electric charges. Thereafter, the set of unprocessed charges produced by the illuminated light sensing cells is converted into a set of corresponding potentials and transferred to the capacitors on a capacitor line. Finally, the potentials stored in the capacitors of the capacitor line are read out.

In one embodiment of this invention, the CMOS light sensor has a plurality of capacitor lines. When the stored potentials inside one of the capacitor lines is read, a set of unprocessed charges produced by the illuminated light sensing cells is converted into a set of corresponding potentials and transferred to any of the capacitor lines other than the one involved in the reading operation. The potentials in these other capacitor lines are subsequently read according to a pre-defined sequence.

In brief, this invention uses a capacitor line having a count of capacitors smaller than the count of light sensing cells in a light sensing line. Therefore, the time for reading out all the potentials from the capacitors along a capacitor line is shortened. With considerably reduction in reading time, the amount of charges leaking out from each capacitor is minimized and hence the degree of data distortion is reduced considerably.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
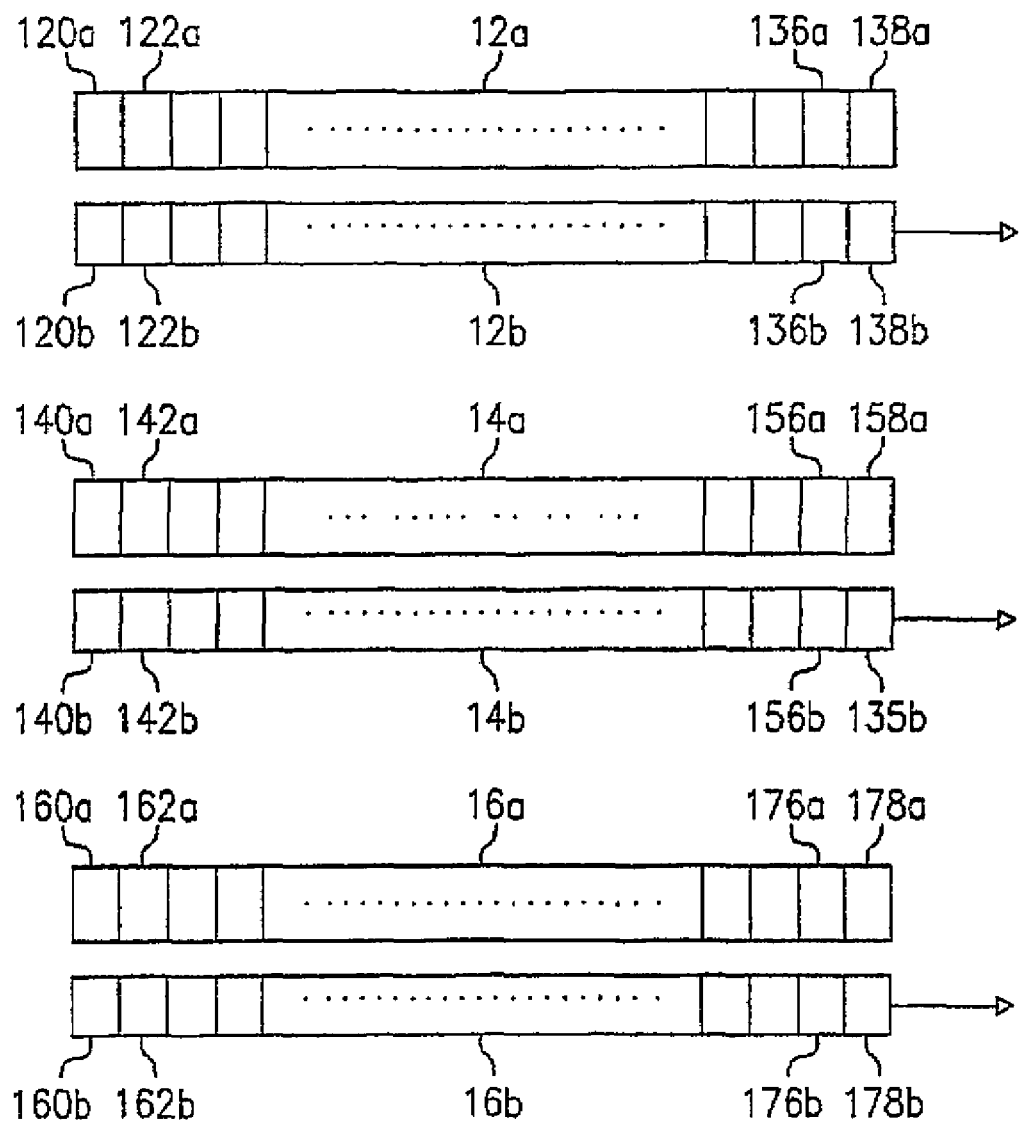
FIG. 1 is a schematic diagram showing the relationship between the light sensing lines and the capacitor lines in a conventional CMOS light sensor.

Reference will now be made in detail to the present preferred embodiments of the invention, examples of which are illustrated in the accompanying drawings. Wherever possible, the same reference numbers are used in the drawings and the description to refer to the same or like parts.

Figure 2:
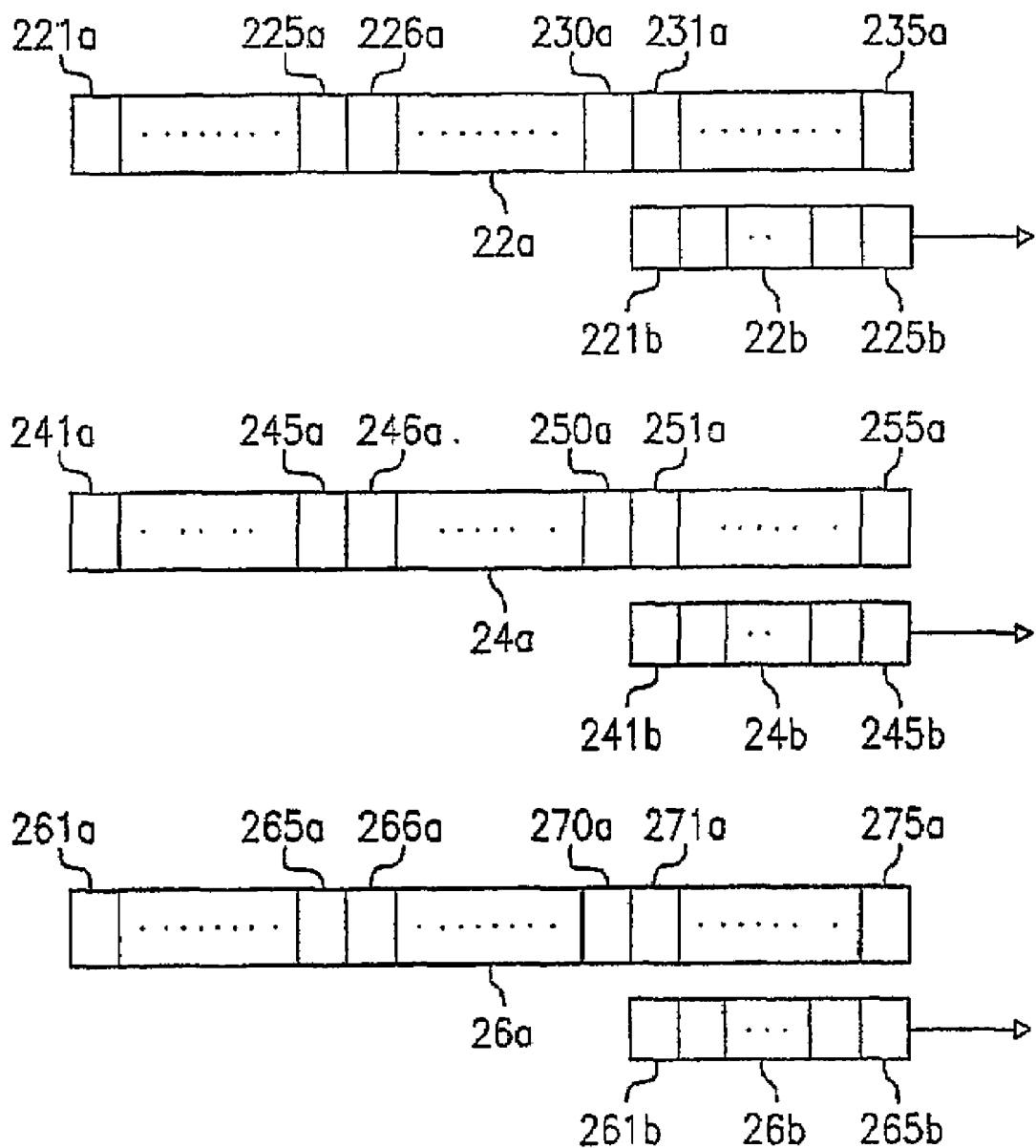
FIG. 2 is a schematic diagram showing the relationship between the light sensing lines and the capacitor lines in a linear CMOS light sensor according to one preferred embodiment of this invention.

FIG. 2 is a schematic diagram showing the relationship between the light sensing lines and the capacitor lines in a linear CMOS light sensor according to one preferred embodiment of this invention. As shown in FIG. 2, the CMOS light sensor 20 includes three light sensing lines 22a, 24a, 26a for sensing the three primary colors red (R), green (G) and blue (B) respectively. In addition, the CMOS light sensor 20 also includes three capacitor lines 22b, 24b, 26b for holding potentials produced by the respective light sensing lines 22a, 24a and 26a. The operational relationship between the three light sensing lines 22a, 24a, 26a and the three corresponding capacitor lines 22b, 24b, 26b are identical. Hence, the operation of only one group of light sensing line and corresponding capacitor line is explained in the following.

In this embodiment, the number of capacitors 221b.about.225b in the capacitor line 22b is set to one third of the number of light sensing cells 221a.about.235a along the light sensing line 22a. Obviously, the ratio of the number of light sensing cells to the number of capacitors can be varied according to actual application. Since the total number of capacitors 221b.about.225b in the capacitor line 22b is only one third that of the number of light sensing cells 221a.about.235a, data must be extracted in stages from the light sensing cells 221a.about.235a. The following is a more detailed description of the operation relationship between the light sensing line 22a and the capacitor line 22b.

Since the number of capacitors 221b.about.225b is only one third of the amount of the light sensing cells 221a.about.235a, the potentials produced by the light sensing cells 221a.about.235a must be transferred into the capacitor line step by step. Because the potential within the sensing cells 221a.about.235a are transferred to the capacitor line 22b in three separate steps, sectional illumination of the CMOS light sensor is preferable. In other words, the light sensing cells 221a.about.225a are illuminated first followed by the light sensing cells 226a.about.230a and then the light sensing cells 231a.about.235a or some other arrangements for these three segments of light sensing cells. Obviously, an alternative arrangement such as illuminating the light sensing cells 221a.about.235a all at once and shifting the resulting potentials into the capacitor line 22b in sequence is also possible. However, this will increase overall leakage of charges from the sensing cells 221a.about.235a and lead to a greater data distortion. Whether the CMOS light sensor is illuminated once or in a multiple of exposures, once a set of charges is produced inside the light sensing cells 221a.about.235a within the light sensing line 22a, the set of charges are converted into electric potentials and stored inside the capacitor line 22b. Thereafter, each potential inside the capacitor line is sequentially read to obtain the required image data.

Figure 3:
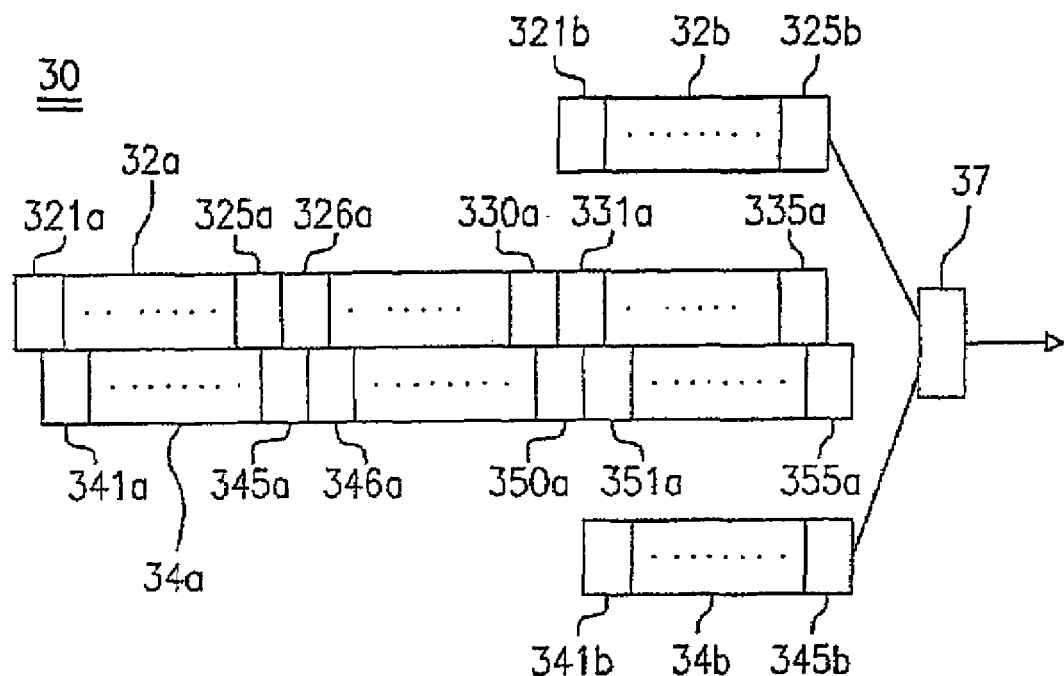
FIG. 3 is a schematic diagram showing the relationship between the light sensing lines and the capacitor lines in a staggered CMOS light sensor according to a first preferred embodiment of this invention.
Figure 4:
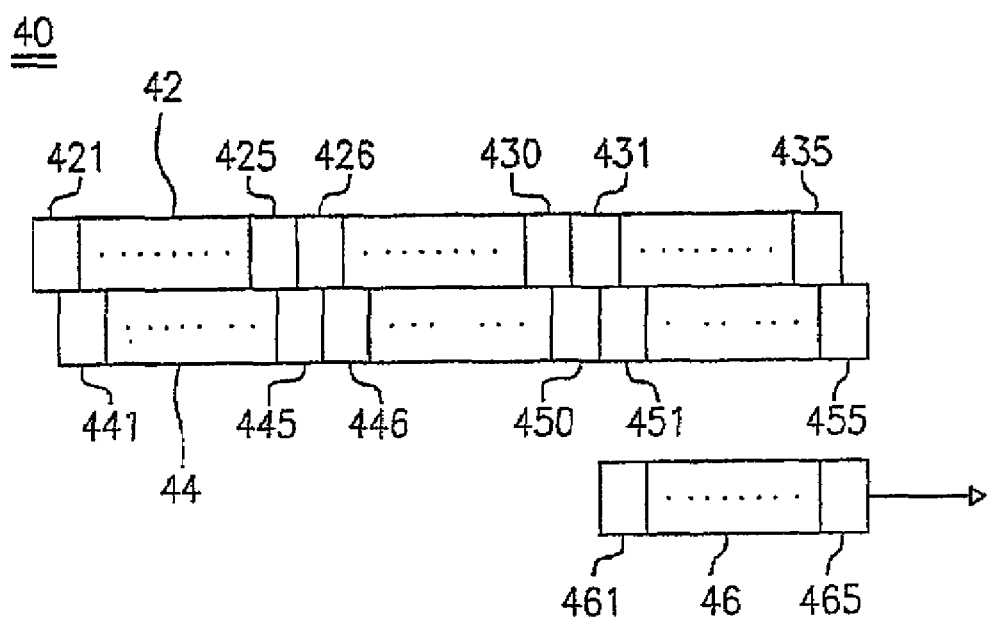
FIG. 4 is a schematic diagram showing the relationship between the light sensing lines and the capacitor lines in a staggered CMOS light sensor according to a second preferred embodiment of this invention.
Figure 5:
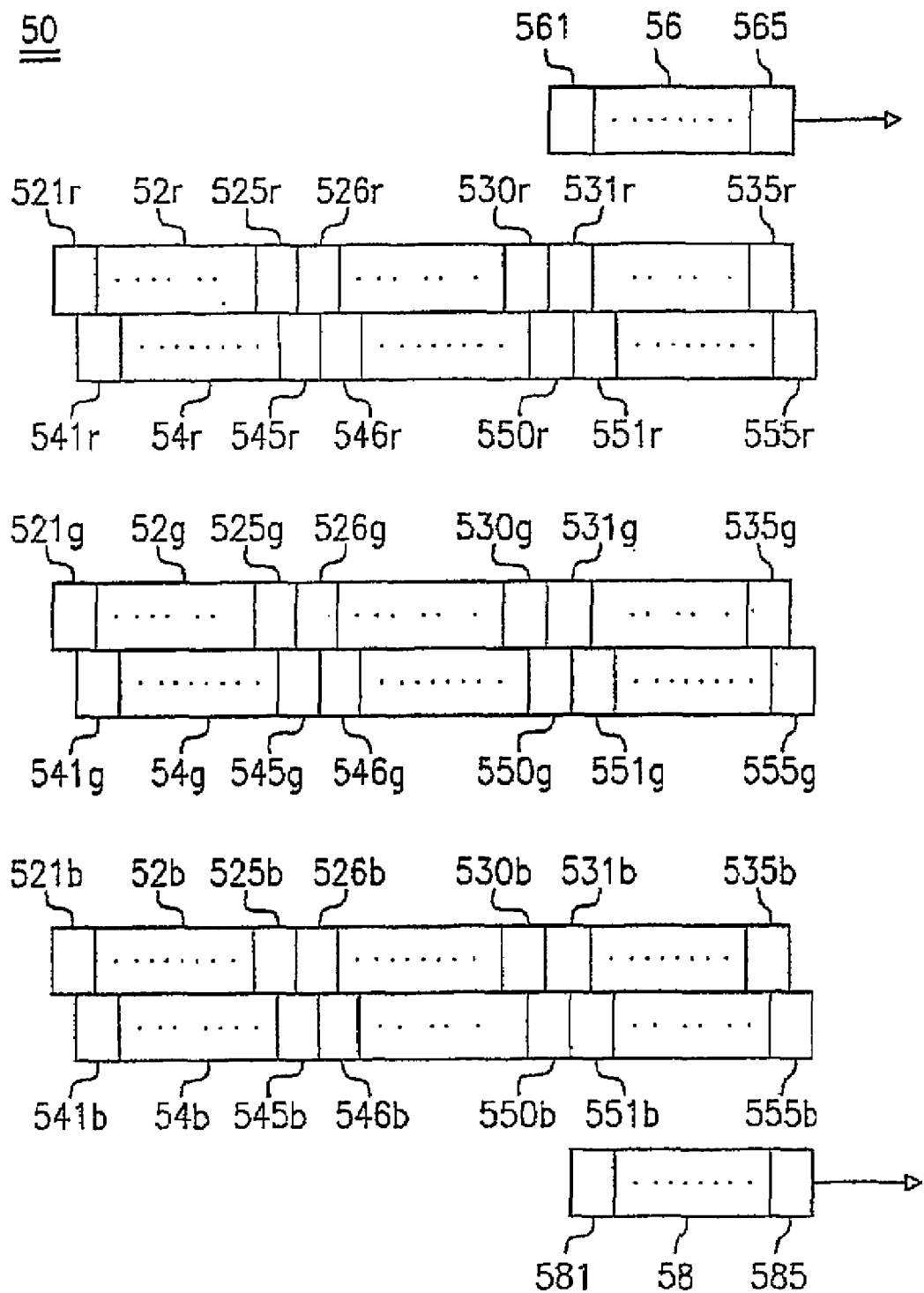
FIG. 5 is a schematic diagram showing the relationship between the light sensing lines and the capacitor lines in a staggered CMOS light sensor according to a third preferred embodiment of this invention.

FIGS. 3, 4, 5 are schematic diagrams showing the relationship between the light sensing lines and the capacitor lines in a staggered CMOS light sensor according to this invention. In FIGS. 3 and 4, only one of the three groups (including the capacitor line that corresponds to the light sensing line) of light sensing lines (R, G, B) is shown. Since the remaining two groups of light sensing lines are identical with the one shown in the Figures, their structures are not drawn. In FIG. 3, a light sensing line 32a is used to capture the intensity of a particular color in the odd pixels of a scan line while another light sensing line 34a is used to capture the intensity of the same color in the even pixels of the scan line. The capacitor lines 32b and 34b are used to hold the potentials after converting the charges that result from the intensity of illumination of the particular color on the light sensing lines 32a and 34a. In FIG. 4, both light sensing lines 42 and 44 correspond with one capacitor line 46. In other words, the capacitor line 46 not only stores the resultant potentials captured by the light sensing line 44, but also stores the resultant potentials captured by the light sensing line 42 as well.

In the embodiment of FIG. 5, two capacitor lines 56 and 58 are utilized by light sensing lines 52r and 54r used for sensing red color, light sensing lines 52g and 54g used for sensing green color and light sensing lines 52b and 54b used for sensing blue color. For example, the capacitor line 56 may serve as a storage area for holding the potentials of odd pixels captured by the light sensing lines 52r, 52g and 52b for various colors. Similarly, the capacitor line 58 may serve as a storage area for holding the potentials of even pixels captured by the light sensing lines 54r, 54g and 54b for various colors. If the number of capacitors in the capacitor line 56 is one-third the number of light sensing cells in a single light sensing line (52r, 52g or 52b), all the potentials captured by the light sensing lines 52r, 52g and 52b must be read nine readout operations. Under the same token, all the potentials captured by the light sensing lines 54r, 54g and 54b must be read in nine readout operations. Obviously, this is not the only arrangement for the light sensing lines and the capacitor lines. Persons skilled in the art may change the arrangement to produce optimal results.

Figure 6:
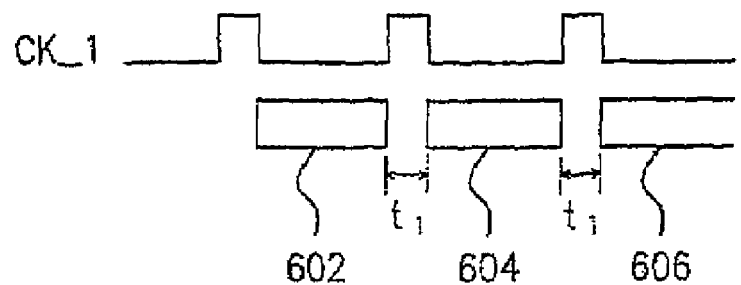
FIG. 6 is a timing diagram showing the operating sequence of a CMOS light sensor system having a single capacitor line and at least one light sensing line therein according to one preferred embodiment of this invention.

After explaining a few light sensing line capacitor line configurations, methods of operating the CMOS light sensor are described below. FIG. 6 is a timing diagram showing the operating sequence of a CMOS light sensor system which has a single capacitor line and at least one light sensing line therein. The light sensing line 22a and the capacitor line 22b shown in FIG. 2 are used as an example for illustrating the timing diagram in FIG. 6. The clocking signal CK_1 in FIG. 6 is a signal for controlling the light sensing line 22a and the capacitor line 22b. When the clocking signal CK_1 is at high potential, potentials captured by the light sensing line 22a are transferred to the capacitors in the capacitor line 22b. As the clocking signal CK_1 drops to low potential, the potentials stored inside the capacitors are sequentially read out from the capacitor line 22b. With this type of timing control, potentials resulted from illuminating the light sensing line 22a are read out in three separate sessions, namely, session one for reading data 602, session two for reading data 604 and session three for reading data 606. Although this is an arrangement capable of saving a few capacitors in a CMOS light sensor, each data reading session must be punctuated by an idling period t.sub.1. This idling period t.sub.1 is required for transferring the electric potential from the light sensing line 22a to the capacitor line 22b. Obviously, the aforementioned arrangement implies that the entire light sensing line 22a is illuminated all at once and then the generated potentials are transferred in separate sessions. If the light sensing line 22a is illuminated in several stages, an exposure time period must also be added to the idling time t.sub.1.

Figure 7A:
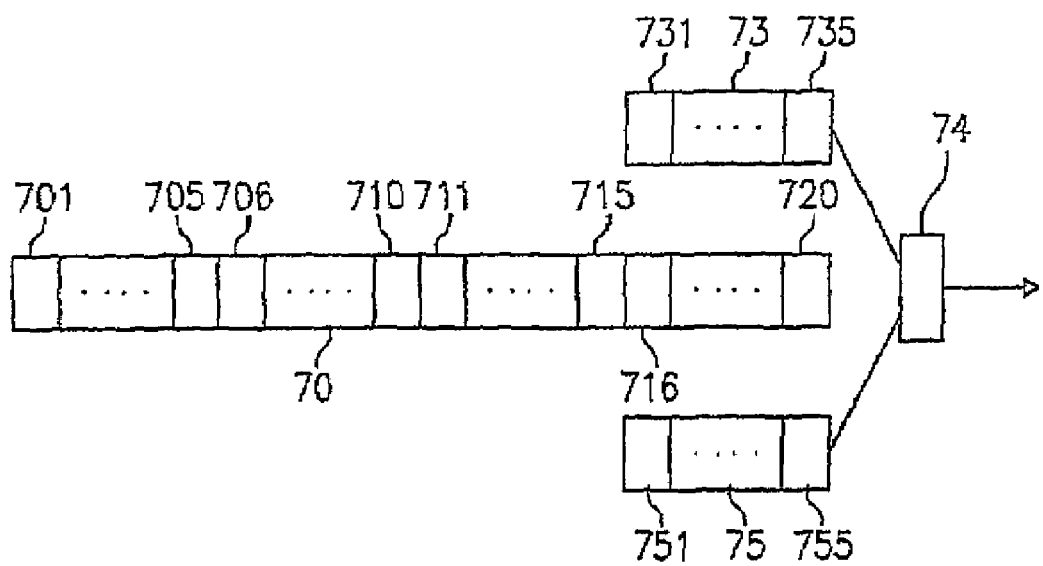
FIG. 7A is a schematic diagram showing a CMOS light sensor system having a multiple of capacitor lines that correspond to a single light sensing line according to one preferred embodiment of this invention.

To reduce idling time caused by non-successive data transmission, this invention also provides a CMOS light sensor having a plurality of capacitor lines that correspond to a light sensing line. FIG. 7A is a schematic diagram showing a CMOS light sensor system having a multiple of capacitor lines that correspond to a single light sensing line according to one preferred embodiment of this invention. Since the light sensing lines and corresponding capacitor lines for each primary color are the same, only a group that includes a light sensing line 70 and a pair of capacitor lines 73 and 75 is illustrated in detail. The potentials gathered by the light sensing line 70 due to illumination are transferred to the capacitor lines 73 and 75. In this embodiment, the number of capacitors within the capacitor lines 73 and 75 is one-fourth the number of light sensing cells in the light sensing line 70. However, persons skilled in the art may arrange the relative number of capacitors and light sensing cells in any ratio that can optimize overall performance.

Figure 7B:
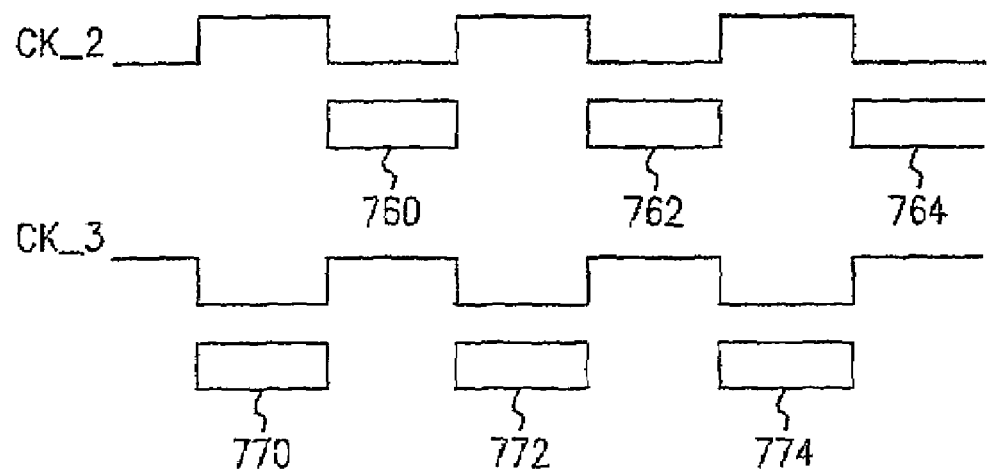
FIG. 7B is a timing diagram showing the operating sequence of the CMOS light sensor system in FIG. 7A.

FIG. 7B is a timing diagram showing the operating sequence of the CMOS light sensor system in FIG. 7A. In FIG. 7B, a clocking signal CK_2 is used for controlling the capacitor line 73 and a portion of the light sensing line 70 and another clocking signal CK_3 is used for controlling the capacitor line 75 and another portion of the light sensing line 70. For example, when the clocking signal CK_2 is at high potential, the potentials gathered by the light sensing cells 701.about.705 or 711.about.715 (as shown in FIG. 7A) due to exposure are transferred to the capacitor line 73. When the clocking signal CK_2 drops back to low potential, the potential values are sequentially read from the capacitor line 73 via the end-stage circuit 74. Similarly, when the clocking signal CK_3 is at high potential, the potentials gathered by the light sensing cells 706.about.710 or 716.about.720 (as shown in FIG. 7A) due to exposure are transferred to the capacitor line 75. When the clocking signal CK_3 drops back to low potential, the potential values are sequentially read from the capacitor line 75 via the end-stage circuit 74. With this arrangement, as long as a proper data length is selected, the data 760, 772, 762, 774 and 764 are linked together to form a continuous data stream. Ultimately, the type of interruption caused by transferring data using a single capacitor line can be avoided.

In summary, this invention provides a means to reduce the time for reading out data stored inside the capacitor line. Hence, the effect charge leakage from the capacitors is greatly minimized. In addition, this invention also provides a structure that uses a plurality of capacitor lines which correspond with a light sensing line and a method of operating this structure. Consequently, very little time is wasted between data transmission and overall operating efficiency of the CMOS light sensor is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A light sensor, comprising:
a light sensing line having a quantity of light sensing cells, wherein the light sensing cells are arranged along a single line on the light sensor; and
a capacitor line having a quantity of capacitors, wherein the capacitor line corresponds to the light sensing line and is configured to store potentials captured by the light sensing cells, and wherein the quantity of light sensing cells arranged along the single line is more than the quantity of capacitors;
wherein the capacitor line is configured to hold the potentials captured by the light sensing cells in response to an illumination of the light sensor.

2. The light sensor of claim 1, wherein the light sensor is configured to transfer the potentials from the light sensing line to the capacitor line in n sequential steps, and wherein n is based on the quantity of light sensing cells compared to the quantity of capacitors.

3. The light sensor of claim 1, wherein the light sensor is configured to illuminate the light sensing cells sequentially, and wherein the light sensor is configured to transfer the potentials to the capacitor line sequentially as each light sensing cell is illuminated.

4. The light sensor of claim 3, wherein the light sensor is configured to illuminate the light sensing cells sequentially in n steps, and wherein n is equal to a ratio of the quantity of light sensing cells to the quantity of capacitors.

5. The light sensor of claim 1, wherein the light sensor is configured to read out the potentials from the capacitor line.

6. The light sensor of claim 5, wherein the light sensor is configured to read out the potentials sequentially.

7. A light sensor, comprising:
a light sensing line having a quantity of light sensing cells, wherein the light sensing cells are positioned along a single line; and
a storage component line having a quantity of storage components, wherein the storage component line corresponds to the light sensing line and is configured to store potentials captured by the light sensing cells, and wherein the quantity of storage components is smaller than the quantity of light sensing cells;
wherein the storage component line is configured to hold potentials captured by the light sensing cells of the light sensing line.

8. The light sensor of claim 7, wherein the light sensing line is configured to sense red, green, or blue.

9. The light sensor of claim 7, wherein the quantity of light sensing cells compared to the quantity of storage components comprises a ratio, n, and wherein the storage component line is configured to extract the potentials in n sequential steps.

10. The light sensor of claim 7, wherein the storage component line is configured to sequentially extract the potentials from the light sensing cells.

11. The light sensor of claim 7, wherein the light sensor is configured to sequentially extract the light sensing cells and wherein the storage component line is configured to extract the potentials sequentially as each light sensing cell is illuminated.

12. The light sensor of claim 7, wherein the light sensor is configured to read out the potentials stored in the storage components.

13. The light sensor of claim 12, wherein the light sensor is configured to read out the potentials sequentially.

14. The light sensor of claim 7, wherein the storage component line is configured to extract the potentials in response to a clocking signal being at a high potential, and wherein the light sensor is configured to sequentially read out the potentials from the storage component line in response to the clocking signal being at a low potential.

15. A method, comprising:
   illuminating a light sensing line that contains a first quantity of light sensing cells positioned along a line;
   producing unprocessed charges with the illuminated light sensing cells;
   converting the unprocessed charges into corresponding electric potentials; and
   transferring the potentials to a storage component line that corresponds to the light sensing line, wherein the storage component line has a second quantity of storage components, and wherein the second quantity is less than the first quantity.

16. The method of claim 15, further comprising transferring the potentials to the storage component line sequentially in n steps, wherein n comprises the ratio of light sensing cells to storage components.

17. The method of claim 15, further comprising transferring the potentials to the storage component line sequentially in n steps, wherein n is based on the second quantity of storage components compared to the first quantity of light sensing cells.

18. The method of claim 15, further comprising illuminating the light sensing cells sequentially and transferring the potentials to the storage component line sequentially as each light sensing cell is illuminated.

19. The method of claim 15, further comprising reading out the electric potentials from the storage components sequentially.

20. The method of claim 15, further comprising:
   transferring the potentials to the storage components in response to a clocking signal being at a high potential; and
   sequentially reading out the potentials from the storage components in response to the clock signal being at a low potential.

21. A light sensor, comprising:
   means for illuminating a first quantity of light sensing cells arranged along a line;
   means for producing unprocessed charges with the illuminated light sensing cells;
   means for converting the unprocessed charges into corresponding electric potentials; and
   means for transferring the potentials to a second lesser quantity of storage components that correspond to the light sensing cells.

22. The light sensor of claim 21, further comprising means for transferring the potentials sequentially in n steps, wherein n comprises the ratio of light sensing cells to storage components.

23. The light sensor of claim 21, further comprising means for transferring the potentials sequentially in n steps, wherein n is based on the quantity of storage components compared to the quantity of light sensing cells.

24. The light sensor of claim 21, further comprising means for storing the transferred electric potentials in the storage components.

25. The light sensor of claim 21, further comprising means for reading out the electric potentials from the storage components.

26. The light sensor of claim 21, further comprising means for reading out the electric potentials sequentially.

27. The light sensor of claim 21, wherein the light sensor is configured so that all of the light sensing cells are to be illuminated substantially simultaneously.

28. The light sensor of claim 21, further comprising:
   means for transferring the potentials to the storage components in response to a clocking signal being at a high potential; and
   means for sequentially reading out the potentials from the storage components in response to a clocking signal being at a low potential.

29. A method, comprising:
   electrically coupling a plurality of light sensing cells arranged in a line to a plurality of storage components, wherein the storage components correspond to the light sensing line and are configured to store potentials captured by the light sensing cells, wherein a quantity of the light sensing cells is greater than a quantity of the storage components, and wherein at least one of the storage components corresponds to more than one of the light sensing cells; and
   configuring the light sensing cells to transfer potentials representing illumination intensity to the storage components.

30. The method of claim 29, wherein the quantity of light sensing cells compared to the quantity of storage components comprises a ratio, n, and wherein the light sensing cells are configured to transfer the potentials from the line of light sensing cells to the storage components in n sequential steps.

31. The method of claim 30, wherein n comprises approximately one third.

32. The method of claim 29, wherein the storage components are arranged into a plurality of storage lines.

33. The method of claim 29, wherein the light sensing cells are configured to be illuminated in a plurality of stages.

34. The method of claim 29, further comprising electrically coupling reading circuitry to the storage components, wherein the reading circuitry is configured to sequentially access the storage components.

35. The method of claim 1, wherein the light sensing cells correspond to a same scan line.

36. The light sensor of claim 7, wherein an output of the light sensing cells corresponds to a single scan line associated with the light sensor.

37. The method of claim 15, wherein the light sensing cells correspond to a same scan line.

38. The light sensor of claim 21, wherein an output of the light sensing cells corresponds to a single scan line associated with the light sensor.

39. The method of claim 29, wherein the light sensing cells correspond to a same scan line.

* * * * *